(12) United States Patent
Leonardi et al.

(10) Patent No.: US 6,614,094 B2
(45) Date of Patent: Sep. 2, 2003

(54) HIGH INTEGRATION DENSITY VERTICAL CAPACITOR STRUCTURE AND FABRICATION PROCESS

(75) Inventors: Salvatore Leonardi, Aci S. Antonio (IT); Roberto Modica, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/747,167

(22) Filed: Dec. 21, 2000

(65) Prior Publication Data

US 2001/0015429 A1 Aug. 23, 2001

(30) Foreign Application Priority Data

Dec. 21, 1999 (IT) .......................................... MI99A2666

(51) Int. Cl.[7] .............................................. H01L 29/00
(52) U.S. Cl. ........................ 257/532; 257/520; 257/510
(58) Field of Search ................................. 257/532, 622, 257/520, 349, 534, 510

(56) References Cited

U.S. PATENT DOCUMENTS 5,838,045 A * 11/1998 Muller et al. ................ 257/532
5,920,108 A * 7/1999 Hemmenway et al. ...... 257/520
6,255,675 B1 * 7/2001 Trimberger .................. 257/532

FOREIGN PATENT DOCUMENTS

JP           53-76686      *  7/1978     .................. 257/532

* cited by examiner

*Primary Examiner*—Mark V. Prenty
(74) *Attorney, Agent, or Firm*—Lisa K. Jorgenson; E. Russell Tarleton; Seed IP Law Group PLLC

(57) ABSTRACT

A vertical capacitor structure fabricated in a semiconductor substrate region overlaid by a buried oxide layer and a buried doped layer, as well as by a semiconductor layer that includes a sinker doped region in contact with the buried doped layer, wherein an oxide trench structure is formed, this oxide trench structure being filled with suitably doped polysilicon to produce, in combination with the sinker region, the plates of the vertical capacitor structure, with the oxide trench structure forming the dielectric therebetween. A process for integrating a vertical capacitor structure starting from a structure blank that includes a semiconductor substrate, a buried oxide layer and a buried doped layer is also provided.

19 Claims, 7 Drawing Sheets

HIGH INTEGRATION DENSITY VERTICAL CAPACITOR STRUCTURE AND FABRICATION PROCESS

TECHNICAL FIELD

This invention relates to a high integration density, vertical capacitor structure and a process for fabricating it, and more specifically, to a vertical capacitor structure formed in a semiconductor substrate region overlaid by a buried oxide layer and a buried doped layer, as well as by a semiconductor layer including a sinker doped region in contact with said buried doped layer and wherein an oxide trench structure is formed. The invention also relates to a process for integrating a vertical capacitor structure, starting from a structure blank which comprises a semiconductor substrate, a buried oxide layer and a buried doped layer.

BACKGROUND OF THE INVENTION

As is well known, most integrated structures with capacitor functions are formed from polysilicon islands P, P1, P2 and/or metallizations that extend horizontally across a suitably oxidized silicon surface S, as shown schematically in FIG. 1.

A major drawback of such structures is the large silicon area they occupy by reason of their horizontal lay, especially where the structures involve high capacitances.

In some applications, such as DRAMs, a vertical type of capacitor structure is used in order to meet reduced silicon area requirements. Structures such as these are fabricated, for example, by providing dielectric trenches in a surface region of the DRAM device, specifically at the integration wells of the MOS components of the device. Structures thus obtained exhibit, however, low capacitances.

The underlying technical problem of this invention is to provide a vertical capacitor structure with such structural and functional features that high capacitance structures can be obtained while keeping the integration area small.

SUMMARY OF THE INVENTION

The disclosed embodiments of the present invention are directed to fabricating high integration density, vertical capacitor structures by utilizing dielectric trenches.

In one embodiment, the invention is directed to a vertical capacitor structure in a semiconductor substrate region overlaid by a buried oxide layer and a buried doped layer, as well as by a semiconductor layer that includes a sinker doped region in contact with the buried doped layer, and an oxide trench structure formed therein that is filled with suitably-doped polysilicon to produce, in combination with the sinker region, the plates of a vertical capacitor structure with the oxide trench structure providing the dielectric therebetween.

In accordance with another aspect of this embodiment of the invention, an electrically conductive region, such as polysilicon or metallization, extends over a plurality of vertical capacitors so formed to connect the underlying legs and thereby form a horizontal capacitor structure as well as a vertical capacitor structure.

In accordance with another embodiment of the invention, a process for integrating a vertical capacitor structure starting from a structure blank that includes a semiconductor substrate, a buried oxide layer, and a buried doped layer is disclosed. The process includes defining a sinker region by forming a semiconductor layer, followed by oxidizing, first masking, depositing a thin pre-implanted oxide, n-type implanting, and thermally diffusing steps; defining an oxide trench structure by removing the oxide from the surface, growing an oxide layer, growing a nitride layer over the oxide layer, masking to define isolated regions, sequentially etching through the dielectric hard mask layer (the combination of the nitride and oxide layers) and the underlying silicon down to the buried oxide layer and oxidizing to grow oxide over the trench sidewalls; depositing doped polysilicon onto the whole surface to a thickness adequate to fill the trench oxidized during the previous step; and planarizing chemically the entire surface of the chip.

In accordance with another aspect of the foregoing process, the polysilicon is doped through discrete depositing steps by implanting enhancement dopant between the depositing steps. Alternatively, the polysilicon is doped in situ during a depositing step. Angled implantations may also be used.

In accordance with yet another embodiment of the invention, a vertical capacitor structure is provided that includes a semiconductor substrate, an oxide layer on the semiconductor substrate; a doped layer on the oxide layer; a semiconductor layer formed on the doped layer; and at least one trench structure formed in a semiconductor layer and filled with a doped region having a vertical central polysilicon region that is electrically isolated from the doped region that in turn communicates with the doped layer on the oxide layer.

In accordance with another aspect of this embodiment of the invention, a dielectric layer is formed between the polysilicon region and the doped region. Ideally, the dielectric layer is formed in contact with the oxide layer.

BRIEF DESCRIPTION OF THE DRAWINGS

The features and advantages of a structure and a fabricating process according to the invention will become apparent from the following description of embodiments thereof, given by way of non-limitative examples with reference to the accompanying drawings, wherein.

In the drawings.

DETAILED DESCRIPTION OF THE INVENTION

Figure 2:
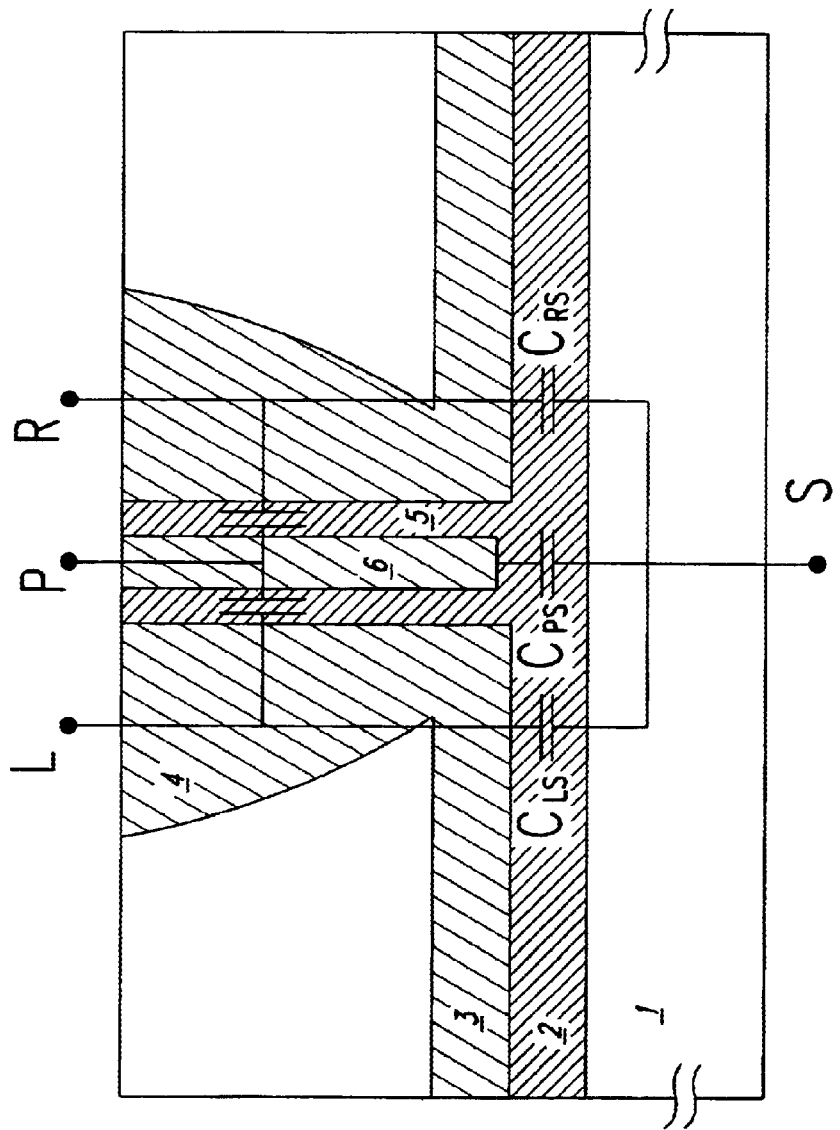
FIG. 2 is a schematic cross-sectional view of a vertical capacitor structure according to the invention, with its equivalent electric circuit superposed.

FIG. 2 shows a vertical cross-section taken through a preferred embodiment of a vertical capacitor structure SCV according to this invention.

It should be noted that, in the example of FIG. 2, a SOI-type substrate is employed which represents a preferred form for a substrate to be used in the structures of this invention. However, the inventive structure could be fabricated in substrates of other conventional types.

The vertical capacitor structure SCV is formed in a semiconductor substrate region 1, for instance in the region that is to provide mechanical support for processing. A buried oxide layer 2, being commonly designated BOX and a typical one of SOI substrates, is formed in the region 1 to provide dielectric insulation between a SOI layer and the substrate.

A buried layer 3, specifically an N type (N+buried) layer, of doped silicon overlies the buried oxide layer 2. The buried layer 3 is needed, e.g., with BiCMOS technologies, for integrating collector regions of NPN bipolar components and drain regions of VDMOS components.

The vertical capacitor structure SCV further comprises, formed over the buried layer 3, a semiconductor layer which includes a sinker doped region 4, also an N type, being in contact with the buried layer 3 and allowing the chip surface to contact the buried regions of the integrated components therein.

Advantageously in this invention, a trench structure 5 of oxide is formed within the sinker region 4 and filled with suitably doped polysilicon 6.

In particular, the oxide trench structure 5 is placed in contact with the buried oxide layer 2, to thus provide for lateral insulation of the components by isolating the wells where they are fabricated.

In particular, such oxide trench structures 5 in contact with the buried oxide layer 2 would be provided whenever a SOI substrate is employed.

The vertical capacitor of this invention has the sinker region 4 and polysilicon 6 as its plates, and has the intervening oxide trench structure 5 as its dielectric.

Shown superposed in FIG. 2 is the electric equivalent of the vertical capacitor structure SCV according to the invention. In particular, four terminals are shown, namely: L and R corresponding to the sinker region 4, P corresponding to the polysilicon 6, and S corresponding to the substrate. Also shown are capacitances created in between them by the layout shown.

These capacitances can be seen to be:

$C_{PL}=C_{PR}$ sinker/oxide/polysilicon capacitance;

$C_{LS}=C_{RS}$ N+ buried/BOX/substrate capacitance; and $C_{PS}$ polysilicon/BOX/substrate capacitance.

Figure 1:
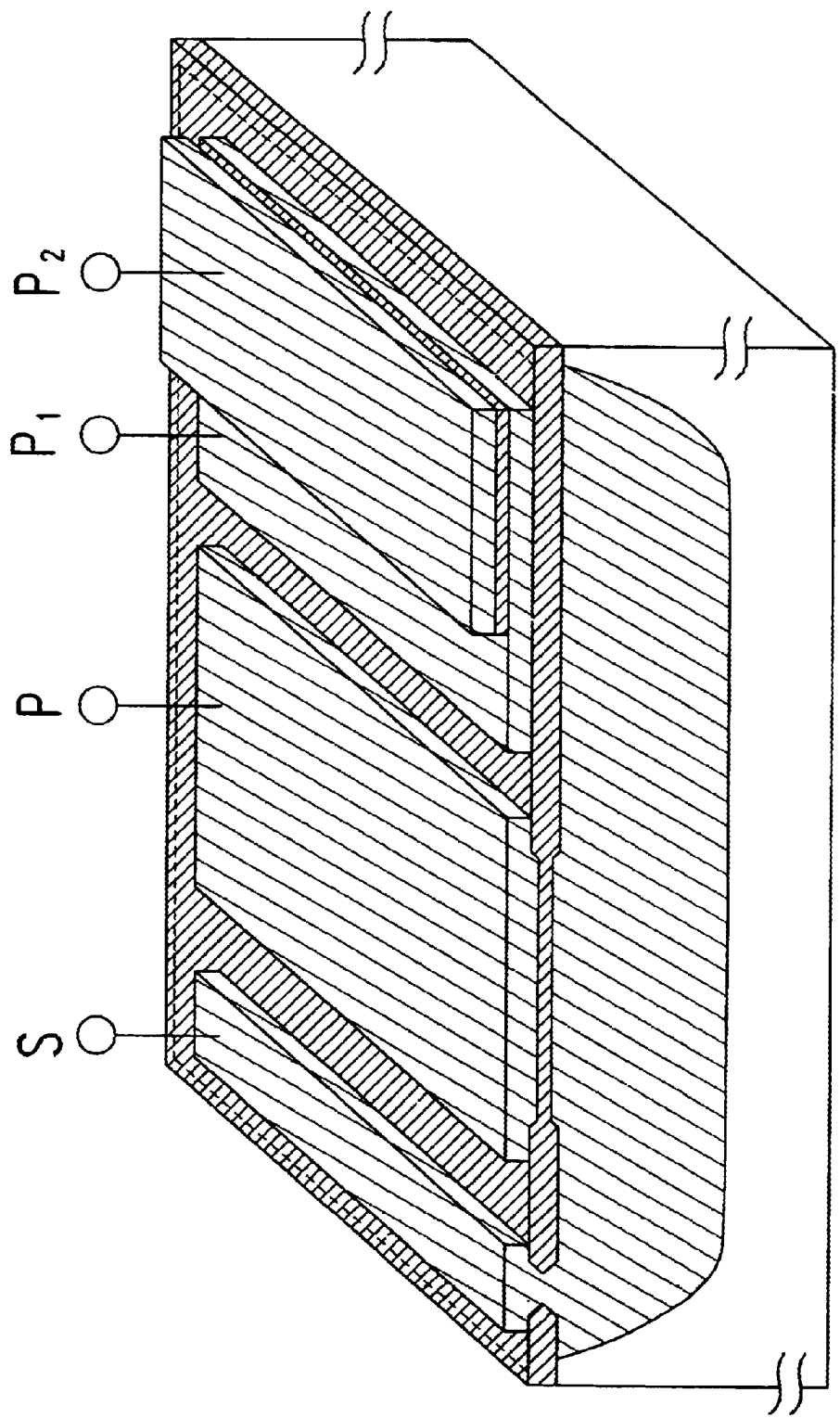
FIG. 1 is a schematic perspective view of a horizontal capacitor structure according to the prior art.
Figure 3:
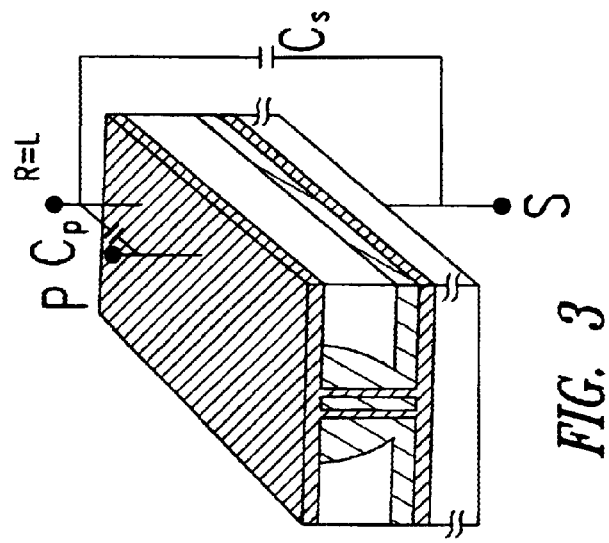
FIG. 3 is a schematic perspective view of a vertical capacitor structure according to the invention.

An analysis of the vertical capacitor structure SCV in three dimensions, as shown in FIG. 3, would reveal that the capacitances $C_{PL}$, $C_{PR}$ and capacitances $C_{LS}$, $C_{RS}$ actually constitute paired capacitances designated $C_P$ and $C_S$, respectively.

At the measuring stage, by shorting the terminal S to the terminal L, the capacitances $C_P$ and $C_S$ are practically paralleled. It should be noted that capacitance $C_{PS}$ is much smaller than capacitance $C_P$, because the buried oxide layer (BOX) 2 would usually be thicker than the oxide layer formed by oxidation of the sidewalls of the oxide trench structure 5, whereas its area would be smaller. Capacitance $C_{PS}$ is therefore trivial compared to capacitance $C_P$.

Thus, capacitance $C_P$ alone is obtained whose value depends on the thickness of the oxide layer formed by oxidation of the sidewalls of the oxide trench structure 5, the lateral surface area (and, therefore, depth) of the oxide trench structure 5, and the length of the polysilicon 6 perimeter.

The depth of the oxide trench structure 5 and the thickness of the oxide layer provided by oxidation of its sidewalls are under the constraint of the integration parameters of the neighboring well, but the length of the polysilicon perimeter can be increased to obtain a desired capacitance.

The process sequence which leads to the vertical capacitor structure SCV of this invention being integrated, will now be described.

The process sequence whereby a structure blank comprising the aforementioned layers 1, 2, and 3 can be obtained, such as by a process of wafer bonding, is well known.

Figure 4:
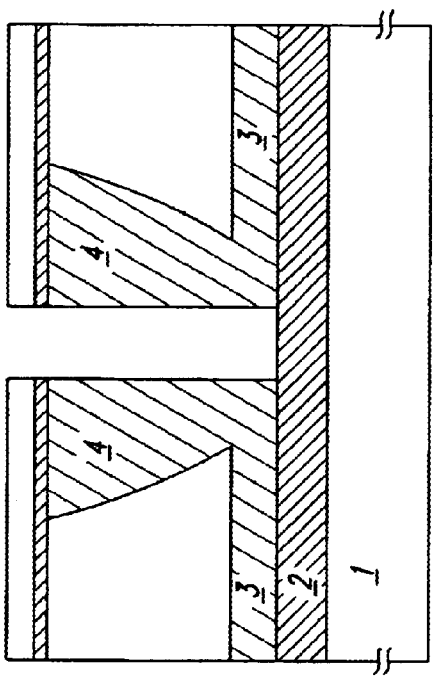
FIGS. 4 to 8 are schematic cross-sectional views in perspective of the vertical capacitor structure shown in FIG. 2, at different stages of its fabrication process.

Starting from this structure blank, a step of forming a semiconductor layer is carried out which is followed by oxidizing and first masking to define the sinker region 4, in turn followed by depositing a pre-implanted thin oxide, N-type implanting, and diffusive annealing, as shown in FIG. 4.

Figure 5:
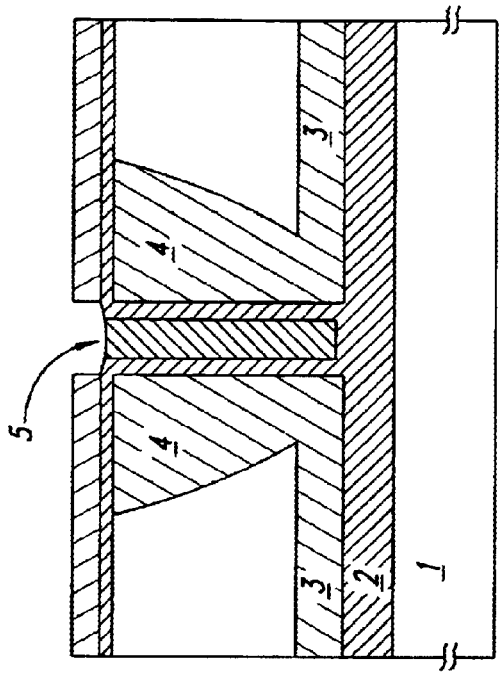

Thereafter, the oxide trench structure 5 is defined through the following steps:

removing the oxide from the surface;

growing an oxide layer;

growing a nitride layer over said oxide layer;

masking to define isolation regions; and sequentially etching, through the dielectric hardmask layer (combined nitride and oxide layers) and the underlying silicon, down to the buried oxide layer 2 as shown in FIG. 5.

Figure 6:
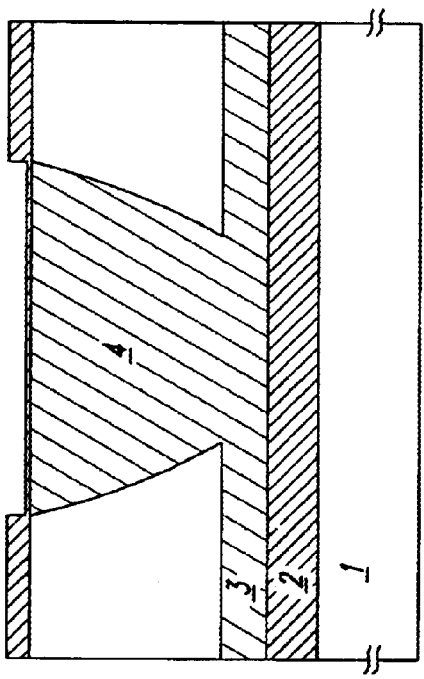

The oxide trench structure 5 is then completed by an oxidizing step for growing oxide on the sidewall surfaces of the trench, and a step of depositing suitably doped polysilicon over the whole surface to fill the oxidized trench as shown in FIG. 6.

It should be noted that the polysilicon may be doped in situ during the deposition, or doped between discrete depositing steps by implantation of the enhancement dopant.

In one embodiment of the process for fabricating a vertical capacitor structure SCV according to the invention, angled implantations are effected for doping the polysilicon 6, i.e., doping the sidewalls of a first deposited polysilicon layer.

Figure 7:
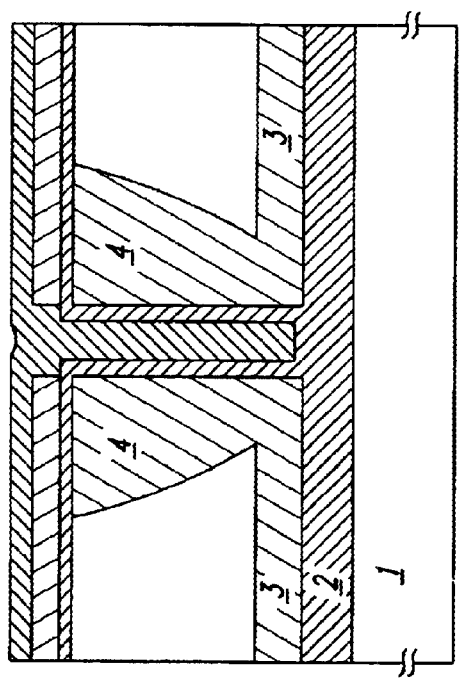

Once the polysilicon is deposited, and regardless of the technique employed for the deposition, a planarizing operation is performed chemically over the whole chip surface, as shown in FIG. 7.

This planarization completes the process of fabricating the vertical capacitor structure SCV according to the invention. There remain to be defined contact regions for external connection.

Accordingly, the following finishing steps will next be carried out:

removing the nitride and hardmask dielectric layers;

so-called pad oxidizing;

nitride growing; and photomasking to define the active regions of the chip integrated components.

In a preferred embodiment of the process for fabricating a vertical capacitor structure SCV according to the invention, the LOCOS technique is used whereby the nitride previously grown over the polysilicon regions where the capacitor contacts are to be made is not etched away, as it usually is in defining the active areas of the components.

Figure 8:
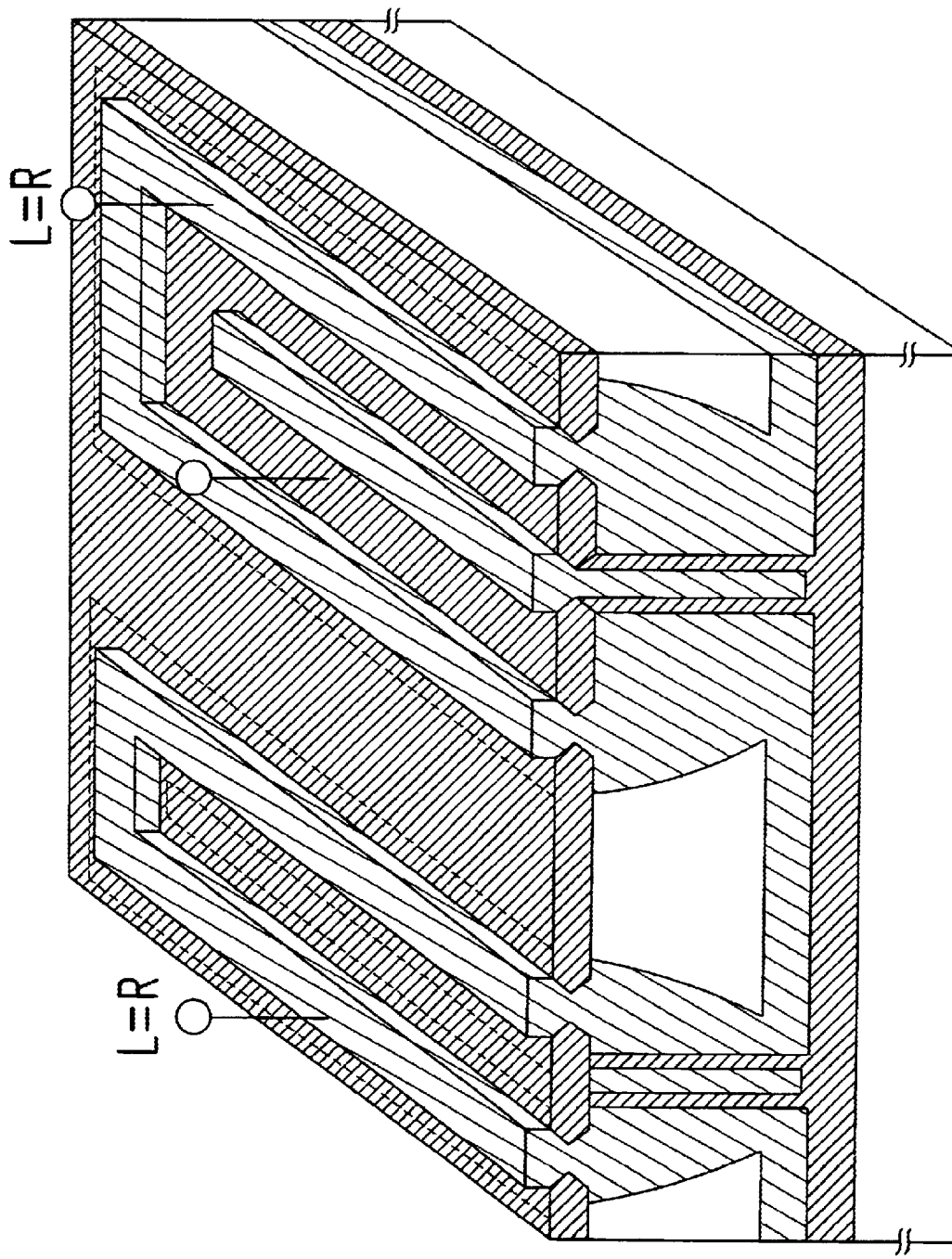

Field oxidation is then performed and the nitride removed from all over the surface, yielding the structure depicted tridimensionally in FIG. 8.

To complete the integration of the active components of generic chip circuitry before and/or after defining the oxide trench structure 5, enhanced regions are formed inside the (P or N) wells.

The vertical capacitor structure SCV may be fabricated by a modified process as described herein below.

Here again, the structure blank including the regions 1, 2 and 3 is assumed to have been made conventionally.

The modified process comprises the following steps:

hardmask etching, silicon etching, and oxidizing to provide the above oxide trench structure 5;

depositing suitably doped silicon by either of the above methods; and planarizing.

It is only at this stage that a semiconductor layer is formed, and a mask is applied to define the sinker region 4. This is followed by N-type implanting and annealing for diffusion. Thus, the sinker region 4 comprising the outer plates of the vertical capacitor SCV of this invention is auto-aligned with the oxide trench 5.

The sinker region 4 also provides some of the chip surface enhancement.

In particular, it should be noted that, when the polysilicon is doped by a double deposition step, the step of masking and implanting region 4 can be carried out between these two depositing steps, while at the same time enhancing the first deposited polysilicon layer with dopant.

To summarize, in this modification of the process, the oxide trench structure 5 is formed ahead of defining the sinker region 4.

Finally, it should be emphasized that either of the above-described process sequences can be also used with traditional substrates and technologies, that is, providing for no buried oxide layer and/or no dielectric trench to isolate laterally integrated components in the chip. In this case, the vertical capacitor structure SCV of this invention would carry added manufacturing cost for integration of the oxide trench structure 5.

On the other hand, with technologies that do provide for a dielectric trench as lateral isolation, integrating the vertical capacitor structure SCV of this invention involves no added cost, because all the processing steps needed are inherent to the process sequence of chip making.

These savings in process steps, and hence cost, plus the reduced space requirements of the vertical capacitor structure SCV are major advantages of the disclosed embodiments of this invention.

Finally, modified embodiments of the vertical capacitor structure SCV may be provided to suit specific applications.

Figure 9:
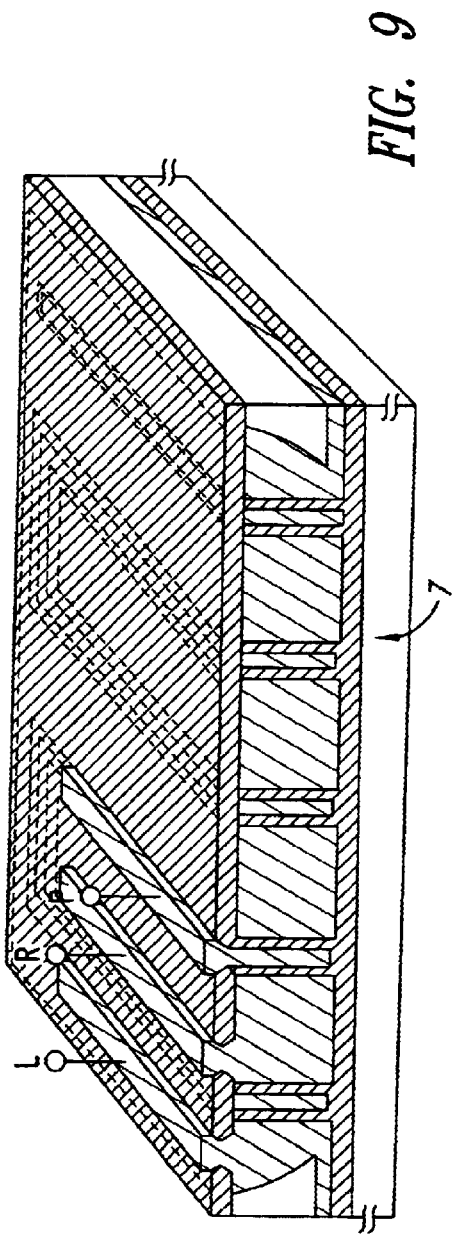
FIGS. 9 to 14 are schematic perspective views of modified embodiments of the vertical capacitor structure according to the invention.

For example, to significantly increase the capacitance $C_P$, a twisting structure led to the terminal P could be used, as shown in FIG. 9. Thus, for the same integration area as horizontal capacitor structures, capacitor structures can be obtained that have several orders higher capacitances.

Figure 10:
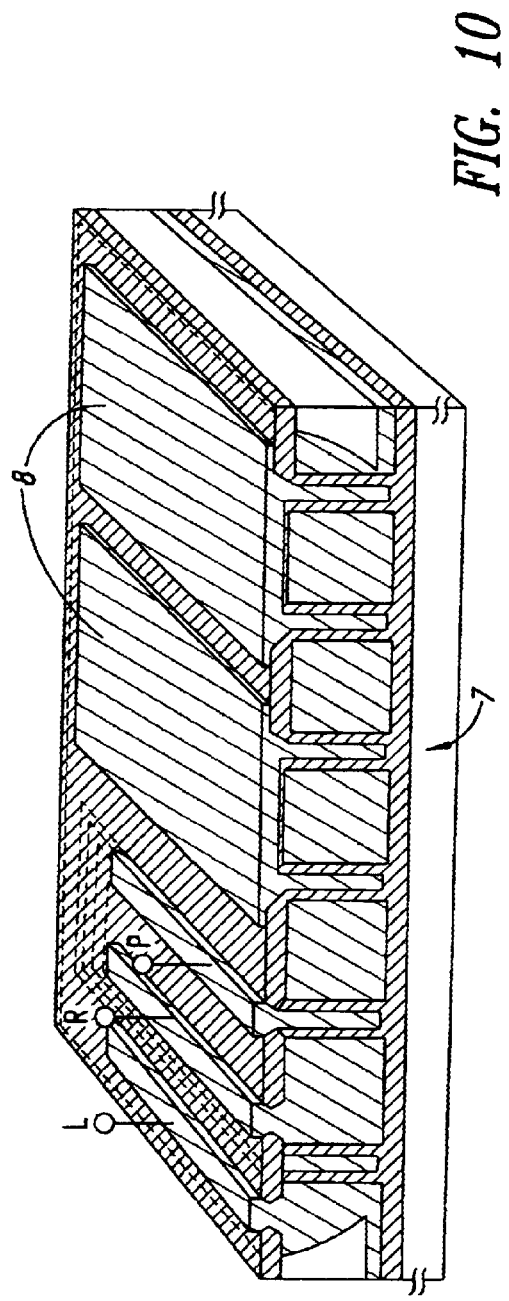

To further increase the capacitance of the vertical capacitor structure SCV of FIG. 9, a polysilicon region 8 or a metallization (or both) could be arranged to overlie the twisting structure 7 and suitably connect to the underlying legs, as shown in FIG. 10.

More generally, the area above the region bounded by vertical capacitor structures SCV can be used to integrate horizontal capacitor structures and suitably connect them to the vertical structures so as to raise the overall capacitance of the structure. In this case, the contribution to overall capacitance would be tied to the dielectric thickness beneath the horizontal structures.

Figure 11:
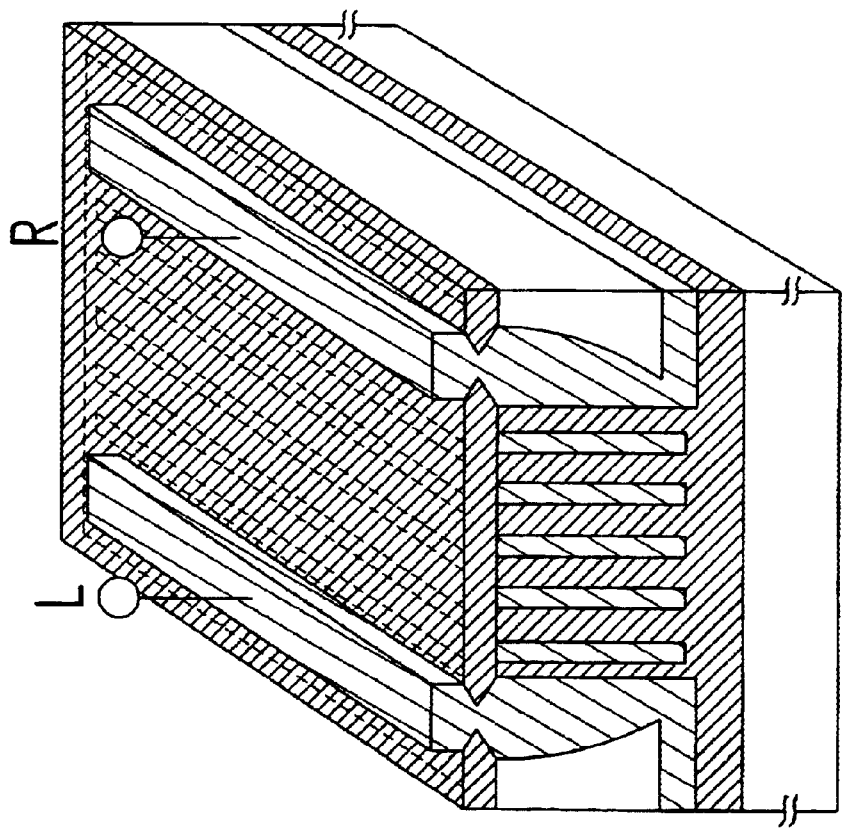

Another modified embodiment of the vertical capacitor structure SCV of this invention consists of oxidizing the middle area of the heavily N doped sinker region 4, leaving only its end regions unaffected, as shown in FIG. 11. Thus, a series of capacitors can be formed all alike in the middle area, and a capacitor obtained whose equivalent capacitance is n times less than the capacitance of the individual capacitors.

Figure 12:
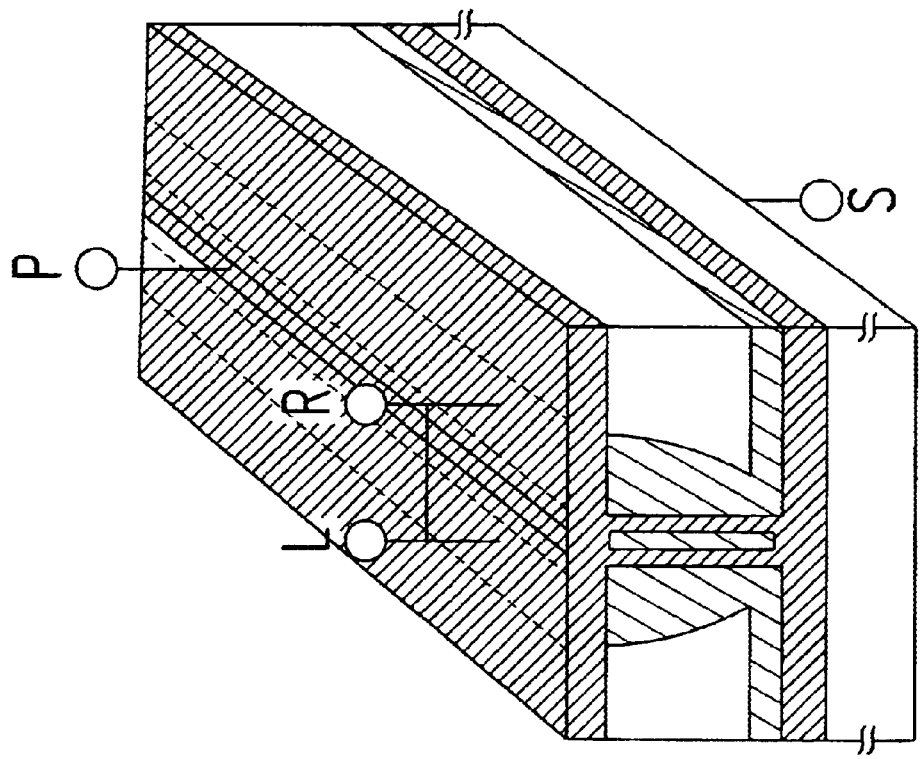

Furthermore, by appropriate connection of the different regions, a parallel of two (or more) identically-made capacitors can be produced to obtain a capacitor with an equivalent capacitance that is twice (or a multiple of) that of the start capacitors, as shown in FIG. 12.

The vertical capacitor structures SCV shown in FIGS. 11 and 12 may be used to advantage whenever capacitors are to be designed with precisely-set capacitances.

Figure 13:
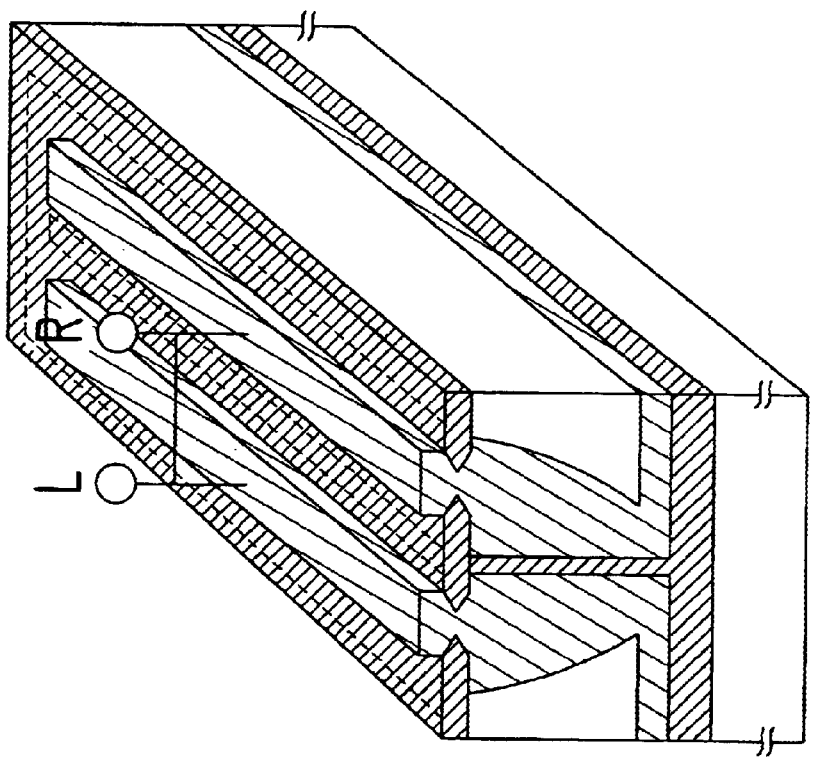

A further modified embodiment of the vertical capacitor structure SCV of this invention is shown schematically in FIG. 13, and consists of forming sufficiently small openings for the oxide trench structures 5 to prevent filling them with polysilicon 6. Thus, the polysilicon depositing and planarizing steps would be unnecessary here because the vertical capacitor comprises the sinker/oxide/sinker layers.

Figure 14:
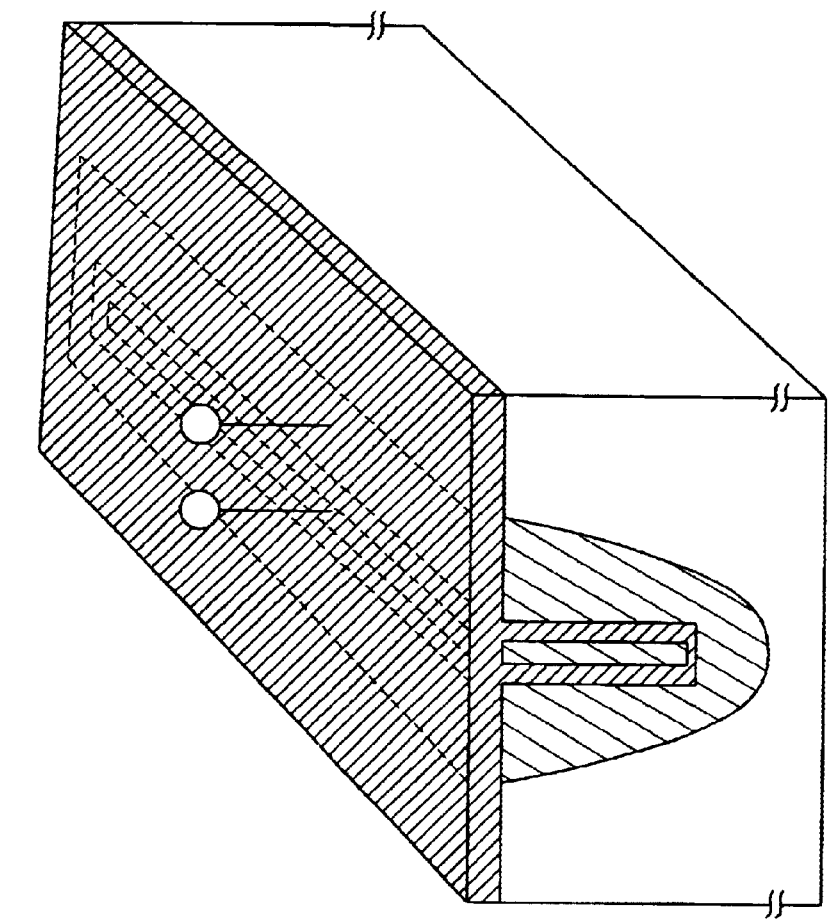

Finally, FIG. 14 shows an embodiment of the invention wherein the vertical capacitor structure SCV is fabricated from a conventional substrate including an oxide trench structure that has been suitably formed in advance.

What is claimed is:

1. A vertical capacitor structure, comprising: a semiconductor substrate region overlaid by a buried oxide layer and a buried doped layer, as well as by a semiconductor layer that comprises a sinker doped region in contact with said buried doped layer and an electrically conductive layer formed over the semiconductor layer, wherein a trench lined with oxide is formed in the sinker doped region;

said oxide-lined trench is filled with doped polysilicon that is in contact with the electrically conductive layer to produce, in combination with said sinker region, the plates of the vertical capacitor structure, with said oxide-lined trench providing the dielectric therebetween.

2. The vertical capacitor structure of claim 1, comprising a twisting structure connected to said polysilicon to increase the equivalent capacitance value of the structure.

3. The vertical capacitor structure of claim 2, comprising a region extending over the twisting structure and connected to the underlying legs.

4. The vertical capacitor structure of claim 3, comprising within said region, horizontal capacitor structures that are suitably connected to the vertical capacitor structure to increase the overall equivalent capacitance value.

5. The vertical capacitor structure of claim 1, wherein said sinker region is oxidized to only leave unaffected the end portions thereof, thereby obtaining a series of capacitors of the same capacitance.

6. A vertical capacitor structure, comprising: a semiconductor substrate region overlaid by a buried oxide layer and a buried doped layer, as well as by a semiconductor layer which comprises a sinker doped region in contact with said buried doped layer, wherein a trench lined with oxide is formed in the sinker doped region;

said oxide-lined trench structure having sufficiently small openings to prevent it from being filled, the vertical capacitor structure having therefore said sinker region as the plates and the oxide of the trench structure as the dielectric thereof.

7. The vertical capacitor structure of claim 6, wherein said oxide-lined trench structure is placed in contact with said buried oxide layer, thereby providing for lateral isolation components jointly integrated with the vertical capacitor structure.

8. A vertical capacitor structure, comprising:

a semiconductor substrate;

an oxide layer formed on the semiconductor substrate;

a doped layer formed on the oxide layer;

a semiconductor layer formed on the doped layer and an electrically conductive layer formed over the semiconductor layer; and a plurality of trench structures formed and interconnected in a doped region in the semiconductor layer, the plurality of trench structures lined with a dielectric having a vertical central polysilicon region that is electrically isolated from the doped region and that is in electrical contact with the electrically conductive layer.

9. The structure of claim 8, wherein the plurality of trench structures on the semiconductor layer communicate with the doped layer.

10. The structure of claim 8, comprising a dielectric layer formed between the polysilicon region and the doped region.

11. The structure of claim 8, wherein the doped region is in contact with the doped layer.

12. The structure of claim 10, wherein the dielectric layer is formed in contact with the oxide layer.

13. The structure of claim 8, wherein the plurality of trench structures are parallel to one another with the interior trench structures covered by an oxidized layer and end trench structures uncovered by the oxidized layer.

14. A vertical capacitor structure, comprising:
   a semiconductor substrate;
   an oxide layer formed on the semiconductor substrate;
   a doped layer formed on the oxide layer;
   a semiconductor layer formed on the doped layer; and
   at least one trench structure formed in a doped region in the semiconductor layer and filled with a central dielectric region that is in contact with the oxide layer.

15. A vertical capacitor structure, comprising:
   a semiconductor substrate;
   an oxide layer formed on the semiconductor substrate;
   a doped layer formed on the oxide layer;
   a semiconductor layer formed on the doped layer; and
   a plurality of parallel trench structures formed in a doped region in the semiconductor layer, the plurality of parallel trench structures lined with a dielectric having a vertical central polysilicon region that is electrically isolated from the doped region, and the interior parallel trench structures covered by an oxidized layer and end trench structures uncovered by the oxidized layer.

16. A vertical capacitor structure, comprising: a semiconductor substrate region overlaid by a buried oxide layer and a buried doped layer, as well as by a semiconductor layer that comprises a sinker doped region in contact with said buried doped layer, wherein a trench lined with oxide is formed in the sinker doped region;
   said oxide-lined trench structure filled with suitably-doped polysilicon to produce, in combination with said sinker region, the plates of the vertical capacitor structure, with said oxide-lined trench structure providing the dielectric therebetween, and further comprising a twisting structure connected to said polysilicon to increase the equivalent capacitance value of the structure.

17. The vertical capacitor structure of claim 16, comprising a region extending over the twisting structure and connected to the underlying legs.

18. The vertical capacitor structure of claim 17, comprising within said region, horizontal capacitor structures that are suitably connected to the vertical capacitor structure to increase the overall equivalent capacitance value.

19. A vertical capacitor structure, comprising: a semiconductor substrate region overlaid by a buried oxide layer and a buried doped layer, as well as by a semiconductor layer that comprises a sinker doped region in contact with said buried doped layer, wherein a trench lined with oxide is formed in the sinker doped region;
   said oxide-lined trench structure filled with suitably-doped polysilicon to produce, in combination with said sinker region, the plates of the vertical capacitor structure, with said oxide-lined trench structure providing the dielectric therebetween, said sinker region oxidized to only leave unaffected the end portions thereof, thereby obtaining a series of capacitors of the same capacitance.

* * * * *